United States Patent [19]

Brown

[11] Patent Number: 5,757,203

[45] Date of Patent: May 26, 1998

[54] MULTIPLE ON-CHIP IDDQ MONITORS

[75] Inventor: Charles Allen Brown, Corvallis, Oreg.

[73] Assignee: Hewlett-Packard Company, Palo Alto, Calif.

[21] Appl. No.: 732,077

[22] Filed: Oct. 16, 1996

[51] Int. Cl.$^6$ ............................................... G01R 31/28
[52] U.S. Cl. ..................................... 324/765; 324/158.1
[58] Field of Search ............................. 324/765, 158.1, 324/73.1; 371/15.1, 21.3, 3, 72, 23, 24, 22.5, 25.1; 361/42, 86, 101, 58, 90-91, 92; 307/311

[56] References Cited

U.S. PATENT DOCUMENTS

| | | | |
|---|---|---|---|
| 5,428,297 | 6/1995 | Grace et al. | 324/758 |
| 5,428,574 | 6/1995 | Kuo et al. | 365/201 |
| 5,552,744 | 9/1996 | Burilson et al. | 327/401 |

FOREIGN PATENT DOCUMENTS 6181247  6/1994  Japan.

OTHER PUBLICATIONS

"Design Of ICs Applying Built-In Current Testing", Journal of Electronic Testing: Theory and Applications 3, 397–406 (1992); By: Wojciech Maly & Marek Patyra, Electrical and computer Engineering Department, Carnegie Mellon University, Pittsburgh, PA 15213, pp. 111–120.

"Measurement of Quiescent Power Supply Current for CMOS ICs in Production Testing", by: Luther K. Horning, Jerry M. Soden, Ron R. Fritzemeier, and Charles F. Hawkins, 1987 International Test Conference—IEEE, Paper 13.1, pp. 300–309.

"Test Technology Newsletter", Sep.–Oct., 1996, by: Tom Williams, Ray Mercer, and Rohit Kapur, the Newsletter of the Test Technology Technical Committee of the IEEE Computer Society, pp. 3–4.

"CMOS IC Fault Models, Physical Defect Coverage, and IDDQ Testing", by: Ronald R. Fritzemeier, Charles F. Hawkins, and Jerry M. Soden, IEEE 1991 Custom Integrated Circuits Conference, IEEE, pp. 13.1.1–13.1.8.

"Proportional BIC Sensor For Current Testing", Journal of Electronic Testing (1992), by: Josep Rius and J. Figueras, Received Jan. 30, 1992, Revised Aug. 17, 1992, pp. 101–110.

"Design of ICs Applying Built–In Current Testing", by: Wojciech Maly and Marek Patyra, Journal of Electonic Testing: Theory and Applications, Rreceived Feb. 5, 1992, Revised Aug. 24, 1992, pp. 111–120.

"Design for Testability: Using Scanpath Techniques For Path–Delay Test and Measurement", Internatinal Test Conference 1991, 1991–IEEE, by: Bulent I. Dervisoglu, and Gayvin E. Stong, of Hewlett–Packard Company, Paper 14.1, pp. 365–374.

"Quiescent Power Supply Current Measurement For CMOS IC Defect Detection", 1989—IEEE—Transactions on Industrial Electronics, vol. 36, No. 2, May 1989, by: Charles F. Hawkins, Jerry M. Soden, Ronald R. Freitzemeier, and Luther K. Horning, pp. 211–218.

*Primary Examiner*—Ernest F. Karlsen
*Assistant Examiner*—Barry C. Bowser
*Attorney, Agent, or Firm*—Raymond A. Jenski

[57] ABSTRACT

In order to measure IDDQ in a large integrated circuit, multiple IDDQ monitors sampling the current drawn by selected portions of the circuit are placed on the integrated circuit chip. The output of each IDDQ monitor is combined and supplied to one output port when any of the IDDQ monitors detect current in excess of a predetermined threshold. The output of each IDDQ monitor is also stored in a memory for subsequent readout at a second output port for detection of particular portions drawing the excessive current.

10 Claims, 4 Drawing Sheets

MULTIPLE ON-CHIP IDDQ MONITORS

BACKGROUND

The present invention generally relates to fault detection for integrated circuits and more particularly relates to excess leakage current detection for integrated circuits which can be used for determination of defective integrated circuits.

Integrated circuits (ICs) manufactured using a CMOS process for digital circuits typically exhibit low current consumption when the circuits are in the powered but quiescent, or static, state. This low current falls within a relatively predictable range of currents depending upon the number of devices and other process parameters and has been used during device manufacturing to sort defective integrated circuit devices from good devices. Such an off-chip monitor is coupled between the power supply and the power input to the IC. Once the monitor is installed in the manufacturing process line, it is reused again and again to test the manufactured ICs. Typically a well behaved CMOS integrated circuit will draw less than 1 microamp while a defective IC will draw much more current. In fact, some researchers believe that IC product quality is significantly enhanced when the threshold for acceptable ICs for present IC designs is 200 nanoamps or less.

Newer CMOS processes, however, are employing transistor channel lengths of less than 1 μm. As this dimension gets smaller, the leakage of the transistors increases—even for transistors which are deemed good. At the same time, the leakage from PN diodes also increases, a significant factor because the N-well which surrounds P channel transistors is typically connected to the positive supply. The leakage from this N region to the P region, which generally is connected to ground potential, adds directly to the other transistor leakage current. To further increase the difficulty in measuring quiescent leakage current (hereinafter IDDQ for power supply current measurement and ISSQ for current measurement to ground potential), present and future IC designs utilize millions of transistors which, in total, can have normal quiescent currents in the range of hundreds of microamps or more. Detection of IDDQ defects exceeding the 200 nanoamp range (but not by excessive amounts) in one part of a much larger circuit is very difficult in the presence of the background "noise" of normal quiescent current from the remainder of the larger circuit.

One proposed solution to the swamping of an indicator IDDQ defect current of one portion of a much larger circuit by the normal quiescent current is to separate the N-well supply from the transistor supply. While this approach may be effective in some applications where reducing the normal quiescent current by a factor of two makes detection of IDDQ defects easier, its use leads to another problem. In very large IC designs, a major limitation in the design is the size of the real estate required on the surface of the IC to provide the required metalization to connect to the input/output pads. Increases to the die area make each die more expensive and reduces the yield.

Thus, a solution to the problem of measuring IDDQ defects in the presence of much larger normal quiescent current without substantially adding to the size of the IC die is needed for large circuit designs.

SUMMARY OF THE INVENTION

An integrated circuit includes multiple integral quiescent current detectors which enables a process of testing the quiescent current of the integrated circuit to be performed. Power is supplied to at least one power supply input port of the integrated circuit and an activation port is provided for accepting an activation signal applied to the integrated circuit. First and second quiescent current detectors are coupled between the power supply input port and respective first and second power sinks. Each quiescent current detector generates an overcurrent signal when the activation signal is present and a predetermined current threshold is exceeded by the respective first and second power sinks. A signal combiner, coupled to the first and second quiescent current detectors, generates an error signal when one of the overcurrent signals from said first or second quiescent current detectors has been generated. The output of the signal combiner is coupled, as an error signal, to a first output port of the integrated circuit. A storage element, coupled to the first and second quiescent current detectors, stores the overcurrent signals from the first and second quiescent current detectors and couples the stored overcurrent signals to a second output port of the integrated circuit.

DETAILED DESCRIPTION OF A PREFERRED EMBODIMENT

In order to overcome the problem of measuring IDDQ defects in the presence of a much larger normal quiescent current without substantially adding to the size of the IC die, an IDDQ monitor is moved from its conventional position as an off-chip monitor shared by each IC during its manufacture to an on-chip monitor. Merely moving the position of an IDDQ monitor (which has been suggested by others, see Rius et al., "Proportional BIC Sensor for Current Testing", Journal of Electronic Testing: Theory and Applications, 3, 1992, pp 387–396; and Maly et al., "Design of IC's Applying Built-In Current Testing", Journal of Electronic Testing: Theory and Applications, 3, 1992, pp. 397–406.), however, does not necessarily solve the stated problems but does increase the die size by making the once-shared resource into a proprietary resource on each IC. In a preferred embodiment of the present invention, the power-consuming circuitry is divided into predetermined segments of circuitry, preferably segments which are affiliated, have similar power needs, or have related process steps, and supplied from a common power supply bus via a unique IDDQ monitor for each segment. Thus, multiple IDDQ monitors are distributed across the IC surface near a common power supply metalization so that each segment of IC circuitry is independently monitored by its own IDDQ monitor.

Figure 1:
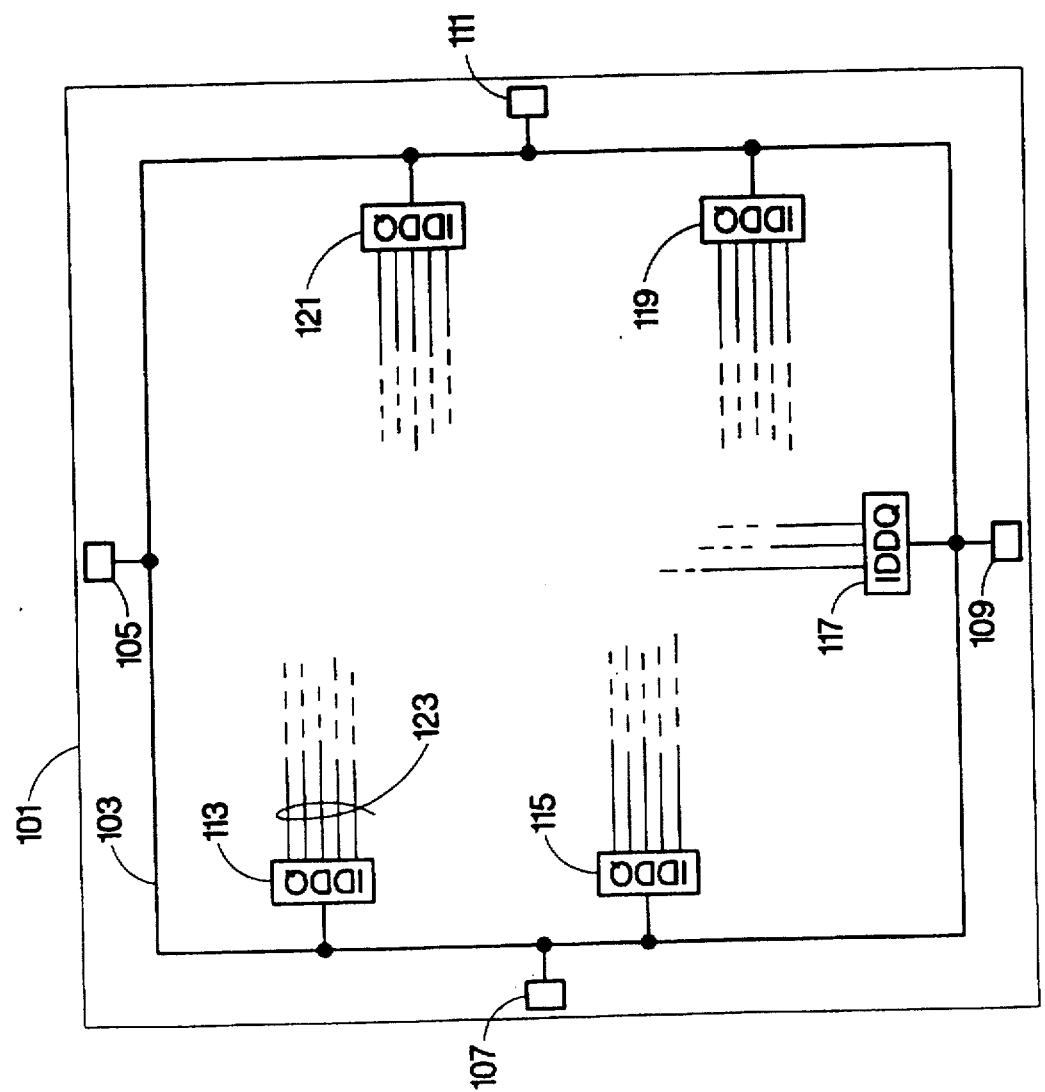
FIG. 1 is an illustration of a power supply routing for an integrated circuit employing multiple IDDQ monitors consistent with the present invention.

An integrated circuit die 101 is diagrametrically shown in FIG. 1. A power supply trace or bus 103 is laid out along the periphery of the service of the semiconductor die 101 and connected to input pads 105, 107, 109, and 111. Of course, the actual layout of the power supply trace and the number and position of the input pads are dependent upon the particular needs and requirements of a given integrated circuit. Connected to the power supply trace 103 are several IDDQ detectors 113, 115, 117, 119, and 121. Output from each of the IDDQ monitors are traces (such as traces 123)

which connect the monitored power supply to other circuitry within the integrated circuit. Each IDDQ monitor, then, supplies a selected portion of the operating circuitry of the integrated circuit with power tapped from the power supply bus 103. As mentioned before, the selection of integrated circuit portion in the preferred embodiment is made such that the nominal quiescent current is less than 200 nanoamp limit. Not only does the distributed IDDQ monitor circuit allow detection of excessive standby current, but such distribution allows smaller transistor sizes to be used in the IDDQ device 301 of FIG. 3 (because of the lower amounts of current each transistor must pass) and because the IDDQ circuitry can be located in convenient gaps between the other circuitry of the integrated circuit. In contradistinction one large IDDQ circuit would cause a particular amount of die area to be dedicated to the IDDQ function whereas distributed IDDQ circuitry can be placed at locations where a smaller circuit would not disrupt circuit layout.

Figure 2:
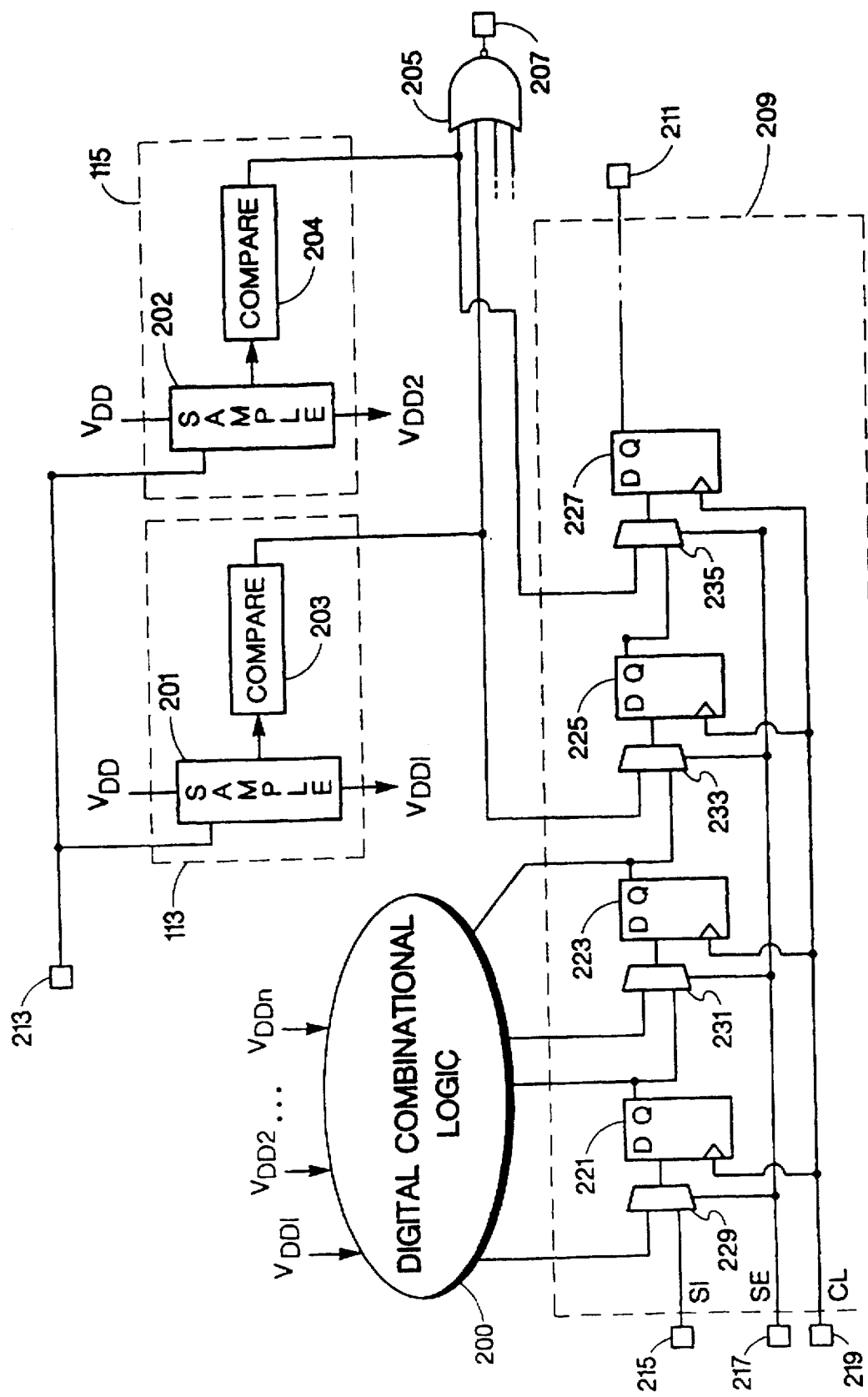
FIG. 2 is a block diagram of an IDDQ monitor which may be employed in the present invention.

In the preferred embodiment, a CMOS integrated circuit utilizing in excess of one million transistors also includes approximately 250 IDDQ monitor circuits preferably distributed close to the power supply trace and near the periphery of the surface of the integrated circuit. A block diagram of one of the IDDQ circuits 113 is shown in FIG. 2. Power supply ($V_{DD}$) is tapped from the power supply trace and the amount of current drawn by the portion of the digital combinational logic 200 of the IC which is connected to the power supply through this connection ($V_{DD1}$) is sampled by current sampler 201. The output from sampler 201 is a current consumption signal representative of the current drawn by the portion of the digital combinational logic 200 of the IC circuitry connected to $V_{DD1}$. Similar connection is made via IDDQ circuit 115 and current sampler 202 to supply $V_{DD2}$ to a different portion of digital combinational logic 200. The current consumption signal of IDDQ monitor 113 is coupled to a comparator 203 where it is compared to a reference signal. Likewise, the current consumption signal of IDDQ monitor 115 is coupled to a comparator 204 for comparison to a reference signal. When a current consumption signal exceeds the reference signal, an overcurrent signal is output from comparator 203 to indicate that the amount of current being drawn by the connected integrated circuit circuitry exceeds the threshold allowable quiescent current (which in the preferred embodiment is established at 200 nanoamps). It is possible, of course, to merely couple the overcurrent signal from each IDDQ current detector to an output port for subsequent protection by off-chip analysis equipment. Such a configuration, however, would require one output pad for each IDDQ circuit. For an integrated circuit having an area-constrained design, the additional pad area and innerconnect metalization consume an unacceptable amount of IC real estate. It is a feature of the present invention that the overcurrent signal output from comparator 203, comparator 204, and the overcurrent signals from each of the other IDDQ circuits on the IC are combined by the signal combiner 205. In the preferred embodiment this signal combiner is realized as a NAND gate. The error signal output of the combiner 205 is made to a single output port, or pad, 207 for coupling to off-chip analysis equipment.

Since the IDDQ current monitoring is divided between a number of IDDQ monitors, it is often desirable to know which portion of the IC circuitry has experienced the failure and excessive quiescent current drain. This knowledge is helpful in analyzing IC failures and can be used to pinpoint design and process problems which are related to a particular portion of the IC circuitry. It is a feature of the present invention that the overcurrent signal is coupled from the comparator 203 to a storage element which, when coupled to similar storage elements of the other IDDQ monitor circuits of the IC, provides a sequential individual output for each IDDQ monitor. Each of these storage elements can subsequently be queried from the external analysis equipment to locate a particular IC circuit portion which has experienced the failure. Such a combination of storage elements is included as part of a scan chain 209 function of the IC and, when the scan chain is interrogated by the external analysis equipment, outputs of each of the storage elements is presented at an output port or pad 211.

A digital IC when it is being tested is typically run through a multitude of sequential steps and the states of many of the circuits of the IC are observed between each step of the testing program. (See, for example, Dervisoglu et al., "Design For Test Ability: Using Scan Path Techniques For Path-Delay Test And Measurement", Proc. Intel. Test Conf., 1991, pp. 285–292). Between each step, a test or activation signal is applied to scan ports (such as activation port 213, scan-in (SI) port 215, scan enable (SE) port 217, and the clock (CL) 219 port) to cause the scan chain to output the state of each of the tested integrated circuit circuits for analysis by external equipment. The signal applied to the activation port 213 is a pulse which, at the leading edge causes the IDDQ monitor circuits to sample the drawn current and at the trailing edge causes the monitor circuit to hold the sampled value of current. The signals applied to the scan chain ports will be discussed in regard to FIG. 4.

In the preferred embodiment, the scan chain circuit 209 utilizes a plurality of conventional D flip-flops, shown in FIG. 2 as flip-flop 221, flip-flop 223, flip-flop 225, and flip-flop 227. In an IC employing extensive digital combinational logic, a large number of digital functions have their states monitored by a large number of flip-flops. Also, with a large number of IDDQ monitor circuits, a large number of flip-flops are employed to store the output state of each IDDQ monitor. Thus, in showing but four flip-flops in FIG. 2, the actual number of flip-flops in the preferred embodiment is greatly understated. The D input of each function-monitoring flip-flop is coupled to a conventional multiplex circuit, indicated by multiplex circuits 229, 231, 233, and 235, respectively. Input to one port of the multiplex circuits 229 and 231 are taken from selected functions of the IC digital combinational logic 200 and saved as a flip-flop state. The other input to the multiplex circuit is an output taken from another flip-flop (except for multiplex circuit 229 which takes its input from an external source via input pad 215). Input to the multiplex circuit 233 is an overcurrent signal taken from the comparator 203 output. Input to the multiplex circuit 235 is an overcurrent signal taken from the comparator 204 output. When the scan enable (SE) signal is at a low binary state, in the preferred embodiment the overcurrent signals are coupled to the respective flip-flop to set the flip-flop state.

Figure 4:
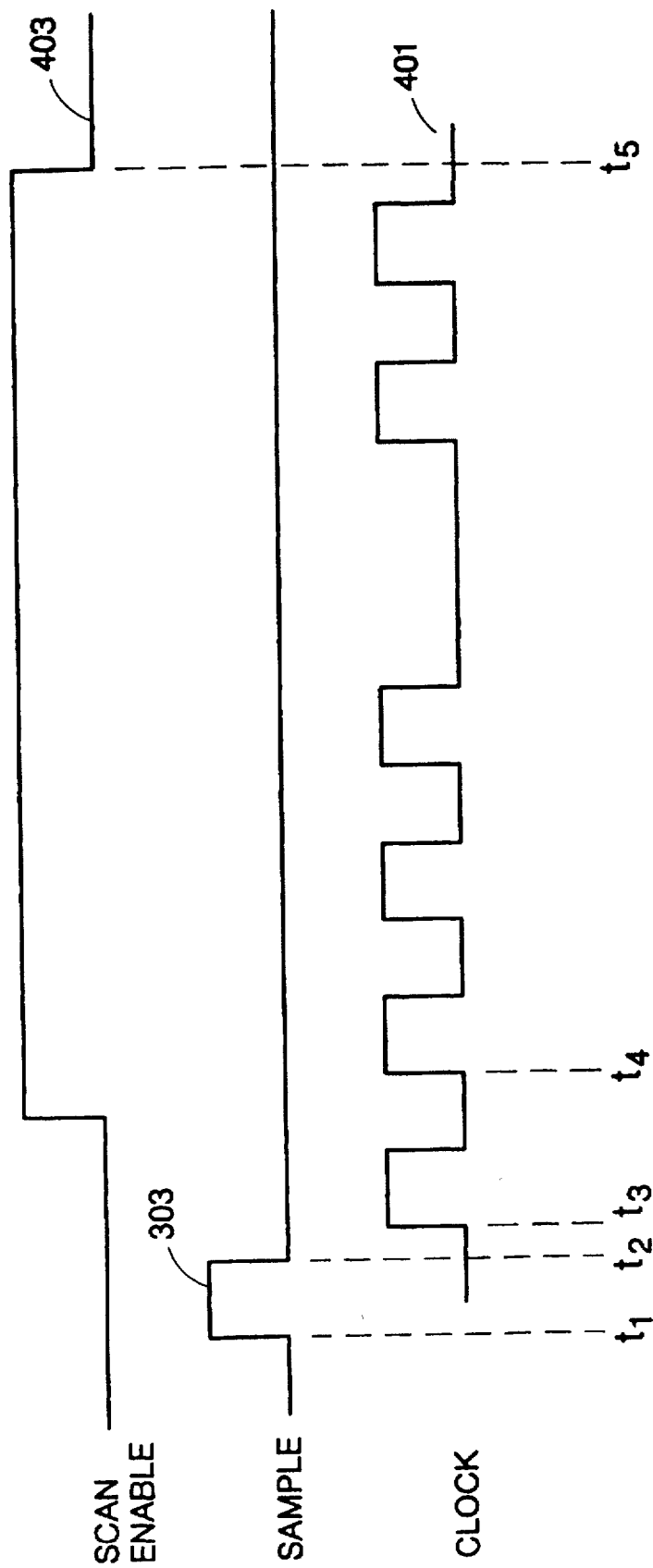
FIG. 4 is a timing diagram illustrating signals which may be employed in the present invention to access IDDQ data.

Thus, when the scan enable signal (SE) is set to a high binary state, the second input to the multiplex circuits (the coupling to other flip-flops) is coupled to the associated flip-flop. That is, when referring to FIG. 2, the SI signal input from pad 215 is coupled to the D input of flip-flop 221, the output from flip-flop 221 is coupled to the input of flip-flop 223, the output from flip-flop 223 is coupled to the input of flip-flop 225, the output from flip-flop 225 is coupled to the input of flip-flop 227, et cetera. The last flip-flop in the scan chain is coupled to the output pad 211. When the clock signal CL is clocked as indicated in FIG. 4, the state from each previous flip-flop is sequenced into the next flip-flop in the chain, thereby rippling the data stored in the individual flip-flops of the scan chain through the scan chain and out to external monitoring equipment via pad 211. When the scan enable (SE) is set low, the scan chain can again begin to drive data to and accept state data from the digital combinational logic and to accept IDDQ monitor current conditions. The timing of the signals input to the IDDQ circuits and the scan chain is shown in the timing diagram of FIG. 4. The signal initiating an IDDQ sample is shown as the SAMPLE signal with a positive pulse 303. The leading edge of this pulse 303 occurs at time $t_1$ and initiates the sample IDDQ state. The width of this pulse controls the current sensitivity for all the IDDQ detectors. The trailing edge, occurring at time $t_2$, holds the IDDQ state in the D flip-flop. The clock signal, trace 401 in FIG. 4, loads the IDDQ state into the scan chain at the leading edge (at $t_3$) of the next clock pulse. Following the scan enable signal 403 being set at a positive value, the leading edge of a clock signal occurring at $t_4$ begins the unloading of the data stored in each of the flip-flops of the scan chain. Each subsequent clock pulse shifts the stored data one flip-flop further down the scan chain and sequentially off the IC via the scan chain output pad 211. When the scan enable signal 403 returns to a ground state, at time $t_5$ the scan chain unloading ceases and the individual flip-flops become available to accept data from the IDDQ monitor circuits and the rest of the digital combinational logic of the IC.

Figure 3:
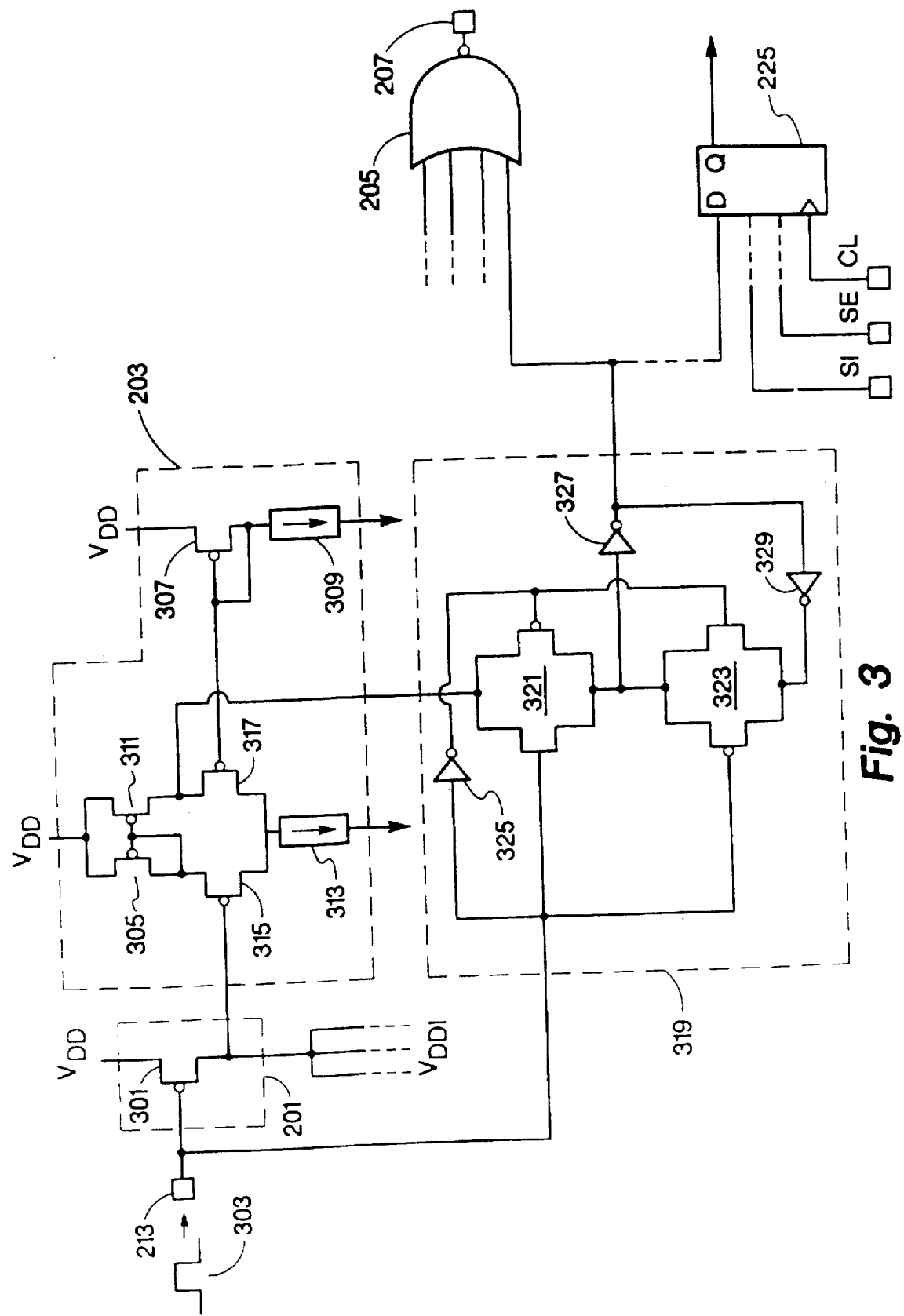
FIG. 3 is a circuit diagram of an IDDQ monitor which may be employed in the present invention.

The circuit diagram of FIG. 3 illustrates an IDDQ monitor employed by the preferred embodiment in a CMOS integrated circuit. A P-channel field effect transistor 301, having a channel with sufficient enough impedance when off to generate a overcurrent signal at the source of the field effect transistor 301 representative of the current drawn by the IC circuit portion coupled to the field effect transistor source but not so great when on as to produce an IR drop which disrupts the supply to the circuit portion. In the preferred embodiment this impedance range is from approximately 1 ohm when on to at least 1 megohm when off and impedance regularly exceeds 10 megohms. The impedance presented by field effect transistor 301 is realized when the activation signal 303 goes to a logic high and is applied to the activation port 213. The current consumption signal output at the drain of P-channel field effect transistor 301 is applied to the gate of the N-channel transistor 315, which is part of the comparator 203. A reference signal of approximately $V_{DD}-1$ volts in the preferred embodiment is generated by the impedance of a P-channel field effect transistor 307 and a conventional current source 309. The reference signal is applied to the gate of N-channel field effect transistor 317. Transistors 305 and 311 are coupled to the voltage power supply $V_{DD}$ through conventional current source 313 and to common via N-channel field effect transistors 315 and 317. The output signal, the overcurrent signal, is taken from the drain of transistor 317 and applied to the timing latch circuit 319. Latch circuit 319, in the preferred embodiment, employs two switches 321 and 323 to make certain the output of 203 is captured in 225 to overcome an inherent timing delay requirement and utilizes the activation signal 303 (and its compliment created by convention inverting amplifier 325) to produce the overcurrent signal (reinverted by conventional inverting amplifier 327) coupled from the source of transistor 317. Inverting amplifier 329 provides an inverted return signal to amplifier 323. Connected in this way, the overcurrent signal is generated when the current consumption signal magnitude exceeds the magnitude of the reference signal The output of combiner 205, a NAND gate in the preferred embodiment, is applied as the error signal to output port 207.

The IDDQ monitors of the preferred embodiment have been connected as current monitors from the supply to the current sink of the coupled IC circuit. It is expected that one of average skill in the art would, with relative ease, be able to sample the current drawn by the individual IC circuit portions by placing an impedance in the ground return connection. The sample of such current is conventionally known as an ISSQ monitor and can be realized by changing the plurality of the field effect transistors and of the logic connections. Although certain advantages may be realized in the implementation of transistor devices in an ISSQ monitor, certain other disadvantages, such as increased impedance to ground, are present. Nevertheless, such a substitution of an ISSQ monitor for an IDDQ monitor falls within the scope of the present invention.

I claim:

1. An integrated circuit having multiple integral quiescent current detectors, comprising:
    at least one power supply input port disposed on the integrated circuit;
    an activation port disposed on the integrated circuit for accepting an activation signal;
    first and second quiescent current detectors coupled between said at least one power supply input port and respective first and second power sinks, each said quiescent current detector generating an overcurrent signal when said activation signal is present and a predetermined current threshold is exceeded by said respective first and second power sinks;
    a signal combiner, coupled to said first and second quiescent current detectors, which generates an error signal when one of said overcurrent signals from said first or second quiescent current detectors has been generated and which couples said error signal to a first output port of the integrated circuit; and
    a storage element, coupled to said first and second quiescent current detectors, which stores said overcurrent signals from said first and second quiescent current detectors respectively and which couples said stored overcurrent signals to a second output port of the integrated circuit.

2. An integrated circuit in accordance with claim 1 wherein said first quiescent current detector further comprises:
    an impedance element coupled in series with said power supply input port and said first power sink whereby a current consumption signal is generated;
    a reference signal generator which generates a reference signal; and
    a comparator which compares said current consumption signal and said reference signal to generate said overcurrent signal when said current consumption signal exceeds said reference signal.

3. An integrated circuit in accordance with claim 1 wherein said storage element further comprises at least one flip-flop coupled to a second activation port whereby said flip-flop stores said overcurrent signal from said first quiescent current detector when said second activation signal is present.

4. An integrated circuit in accordance with claim 1 wherein said storage element further comprises:
    a first flip-flop having an input and an output, said first flip-flop output coupled to said output port of the integrated circuit;
    a second flip-flop having an input and an output, said second flip-flop input coupled to said second quiescent current detector; and a multiplexer, having switchable first and second signal inputs, an output, and an enable signal input for accepting a binary enable signal, said first switchable signal input coupled to said first quiescent current detector and a second switchable signal input coupled to said second flip-flop output and said multiplexer output coupled to said first flip-flop input such that a first level of said enable signal couples said first quiescent current detector to said first flip-flop input and a second level of said enable signal couples said second flip-flop output to said first flip-flop input thereby creating a shift register.

5. An integrated circuit in accordance with claim 4 wherein said first and second flip-flops each further comprise first and second flip-flops having a clock input for accepting a clock signal, whereby the logic state of said second flip-flop output is sequentially coupled to said first flip-flop input and the logic state of said first flip-flop output is coupled to said output port of said integrated circuit upon a change of level of said clock signal when said enable signal is applied to said multiplexer.

6. A method of testing an integrated circuit having multiple quiescent current detectors, comprising the steps of:

supplying power to a power supply port disposed on the integrated circuit;

supplying an activation signal to an activation disposed on the integrated circuit;

generating, responsive to said supplied activation signal, a first overcurrent signal indicating an excess of current flowing from said power supply port to a first power sink and generating a second overcurrent signal indicating an excess of current flowing from said power supply port to a second power sink;

generating an error signal when one of said first overcurrent signal and said second overcurrent signal has been generated;

coupling said error signal to a first output port of the integrated circuit;

storing said first overcurrent signal and said second overcurrent signal in one or more storage elements; and coupling said stored first overcurrent signal and said stored second overcurrent signal to a second output port of the integrated circuit.

7. A method in accordance with the method of claim 6 wherein said step of generating said first overcurrent signal further comprises the steps of:

generating a current consumption signal related to the magnitude of the current flowing from said power supply port to said first power sink;

generating a reference signal;

comparing said current consumption signal to said reference signal to generate said first overcurrent signal when said current consumption signal magnitude exceeds said reference signal magnitude.

8. A method in accordance with the method of claim 6 wherein said step of coupling said stored first and second activation signals further comprises the step of coupling said stored first and second activation signals in timed sequence to said second output port.

9. A method in accordance with the method of claim 6 wherein said storing said first and second overcurrent signals further comprises the steps of:

coupling said first overcurrent signal to an input of a first flip-flop;

coupling said second overcurrent signal to an input of a second flip-flop; generating an enable signal; and coupling an output of said second flip-flop to said input of said first flip-flop when said enable signal has been generated.

10. A method in accordance with the method of claim 9 wherein said step of coupling said stored first overcurrent signal and said stored second overcurrent signal further comprises the steps of:

generating a clock signal; and coupling the logic state of said second flip-flop to the input of said first flip-flop and coupling the logic state of said first flip-flop to said output port of said integrated circuit in response to said clock signal and said generated enable signal.

\* \* \* \* \*